(12) United States Patent
Akita

(10) Patent No.: US 10,034,383 B2
(45) Date of Patent: Jul. 24, 2018

(54) MANUFACTURING METHOD OF PART-MOUNTING PACKAGE

(71) Applicant: NGK SPARK PLUG CO., LTD., Nagoya-shi, Aichi-ken (JP)

(72) Inventor: Kazushige Akita, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 264 days.

(21) Appl. No.: 14/597,935

(22) Filed: Jan. 15, 2015

(65) Prior Publication Data

US 2015/0208512 A1 Jul. 23, 2015

(30) Foreign Application Priority Data

Jan. 20, 2014 (JP) ................................ 2014-008154

(51) Int. Cl.
*H05K 3/00* (2006.01)
*H05K 3/46* (2006.01)
(Continued)

(52) U.S. Cl.
CPC ......... *H05K 3/0097* (2013.01); *H05K 3/0044* (2013.01); *H05K 3/10* (2013.01);
(Continued)

(58) Field of Classification Search
CPC ........ H05K 1/113; H05K 1/116; H05K 1/183; H05K 3/0044; H05K 3/0052;
(Continued)

(56) References Cited

U.S. PATENT DOCUMENTS

2009/0151985 A1* 6/2009 Yokouchi ............. H05K 3/0052
174/250
2012/0222895 A1* 9/2012 Imamura ............. H05K 3/0052
174/260
(Continued)

FOREIGN PATENT DOCUMENTS

JP          06310821 A    * 11/1994
JP       2008-028065 A       2/2008
(Continued)

OTHER PUBLICATIONS

Machine Translation (English) of Japanese Patent Publication, JP 2009-218319, Dec. 2016.*
(Continued)

*Primary Examiner* — A. Dexter Tugbang
(74) *Attorney, Agent, or Firm* — Stites & Harbison, PLLC; Jeffrey A. Haeberlin; James R. Hayne

(57) ABSTRACT

A method of manufacturing a part-mounting package includes: forming a first through-hole in a first insulating sheet and forming a second through-hole whose opening area is larger than the first through-hole in a second insulating sheet; forming a penetration conductor covering an inner surface of the second through-hole and forming a conductor layer on a surface of at least the second insulating sheet; laminating the first insulating sheet and the second insulating sheet where center positions of the first through-hole and the second through-hole are matched to each other; causing linear laser division grooves to pass through a center of the first through-hole and the second through-hole; and dividing the sheet laminated body along the laser division grooves, and causing the side surface recess part and the end face through-hole conductor to appear.

4 Claims, 10 Drawing Sheets

(51) Int. Cl.
*H05K 3/10* (2006.01)
*H05K 3/40* (2006.01)
*H05K 1/11* (2006.01)
*H05K 1/18* (2006.01)

(52) U.S. Cl.
CPC ........... *H05K 3/403* (2013.01); *H05K 3/4611* (2013.01); *H05K 3/4614* (2013.01); *H05K 3/4697* (2013.01); *H05K 1/113* (2013.01); *H05K 1/116* (2013.01); *H05K 1/183* (2013.01); *H05K 3/0052* (2013.01); *H05K 2201/0909* (2013.01); *H05K 2201/0919* (2013.01); *H05K 2201/0949* (2013.01); *H05K 2201/09845* (2013.01); *Y10T 29/49147* (2015.01); *Y10T 29/49165* (2015.01); *Y10T 29/49792* (2015.01); *Y10T 29/49798* (2015.01)

(58) Field of Classification Search
CPC ........ H05K 3/0097; H05K 3/10; H05K 3/403; H05K 3/4611; H05K 3/4614; H05K 3/4697; H05K 2201/0909; H05K 2201/0919; H05K 2201/0949; H05K 2201/09845; Y10T 29/49147; Y10T 29/49165; Y10T 29/49792; Y10T 29/49798

See application file for complete search history.

(56) References Cited

U.S. PATENT DOCUMENTS

2014/0034372 A1* 2/2014 Hasegawa ............ H05K 3/0052
    174/258
2014/0037912 A1     2/2014 Hasegawa et al.

FOREIGN PATENT DOCUMENTS

| JP | 2009218319 A | * | 9/2009 |
| JP | 2010-073711 A | | 4/2010 |
| JP | 2012-227299 A | | 11/2012 |
| JP | 2012-243942 A | | 12/2012 |

OTHER PUBLICATIONS

Japan Patent Office, Office Action (Notification of Reason for Rejection) issued in corresponding Application No. JP 2014-008154, dated May 23, 2017.

\* cited by examiner

MANUFACTURING METHOD OF PART-MOUNTING PACKAGE

CROSS-REFERENCE TO RELATED APPLICATION

This application claims priority to Japanese Patent Application No. 2014-008154, filed with the Japan Patent Office on Jan. 20, 2014, the entire content of which is hereby incorporated by reference.

BACKGROUND OF THE INVENTION

Field of the Invention

The present disclosure relates to a manufacturing method of a part-mounting package.

Description of the Related Art

A part-mounting package includes, for example, a plate-like substrate base having a substrate front surface, a substrate rear surface, and substrate side surfaces. This substrate base has, for example, a multilayer structure including laminated multiple insulating layers and multiple conductor layers. Furthermore, this package may have end face through-hole conductors formed in the substrate side surfaces.

Conventionally, there has been proposed various compact ceramic packages for accommodating an electronic part such as a quartz resonator, a quartz oscillator, and a quartz filter (see, for example, JP-A-2010-73711). FIG. 20 illustrates an example of a conventional ceramic package 80. The ceramic package 80 has the multilayer structure including a plurality of ceramic insulating layers 81 and 82 (ceramic sintered layers) and is provided with a cavity 83 opened at its upper face. A part connection terminal 84 to be connected to the electronic part is provided in a part (for example, a bottom surface) of the cavity 83. Furthermore, external connection terminals 85 to be connected to an external substrate, a through-hole conductor 86, end face through-hole conductors (castellation) 87, wiring patterns 88 of the internal layer (conductor layers), a sealing conductor layer 89, and so on are formed in the ceramic package 80.

The end face through-hole conductors 87 are formed in four corners in the ceramic package 80, respectively. In more detail, in the side surface of each corner of the ceramic package 80, a side surface recess part 90 recessed in the shape of a quarter arc are provided. Further, the end face through-hole conductors 87 are formed in a lower region 91 (the region corresponding to the ceramic insulating layer 82 in the lower layer side) of the side surface recess parts 90. Further, the end face through-hole conductor 87 is connected to the part connection terminal 84 and the sealing conductor layer 89 via the wiring pattern 88 of the internal layer and the through-hole conductor 86.

Here, a manufacturing method of the conventional ceramic package 80 illustrated in FIG. 20 will be exemplified. It is noted that the ceramic package 80 is manufactured by a multi-cavity technique. That is, first, a large size package having a plurality of product regions aligned vertically and horizontally on a flat face is manufactured. Subsequently, it is divided to obtain individual packages 80.

Specifically, first, a conventional known punching (stamping) is applied to a ceramic green sheet made of a ceramic material. Thereby, a through-hole for the through-hole conductor 86, through-holes for the end face through-hole conductors 87, and so on are formed. It is noted here that the through-holes formed for the end face through-hole conductors 87 have a same size both within the green sheet as the ceramic insulating layer 81 in the upper layer side and within the green sheet as the ceramic insulating layer 82 in the lower layer side. Next, a conductive paste is printed on the wall surface of the through-hole. Then, a conductive paste is printed and formed on the surface of the ceramic green sheet so that a predetermined pattern according to the circuit wiring to be formed is resulted. A conventional known punching is then applied to the ceramic green sheet. Thereby, a through-hole for the cavity 83 is formed.

Then, a plurality of ceramic green sheets is laminated, a predetermined weight is applied thereto in the thickness direction by using a conventional known laminating apparatus to press and integrate them, and thereby the ceramic green sheet laminated body is formed. Here, the ceramic green sheets are laminated while positioning the through-holes for the end face through-hole conductors 87 in each ceramic green sheet so that these through-holes are vertically overlapped.

Then, a grooving in the ceramic green sheet laminated body is performed by a laser irradiation by using a laser machining apparatus, and a plurality of laser division grooves for obtaining divided individual product regions is formed. At this time, the grooving is performed so that two laser division grooves 94 intersect at the center of the through-hole 93 for the end face through-hole conductor 87 (see FIG. 21). In a subsequent firing process, this laminated body is heated at a predetermined temperature at which alumina can be sintered. In the laminated body after this firing, each ceramic green sheet and the conductive paste have been sintered. In this way, a large size ceramic package is obtained. In each of the product regions in this package, formed are metalized conductor layers such as the part connection terminal 84, the external connection terminals 85, the through-hole conductor 86, the end face through-hole conductors 87, the wiring patterns 88 of the internal layer, and the conductor layer 89.

Further, the metalized conductor layers such as the wiring patterns 88 of the internal layer, the through-hole conductor 86, and the end face through-hole conductors 87 is utilized to supply a current to the metalized conductor layers such as the part connection terminal 84 and the conductor layer 89. A plating layer is then formed on the metalized conductor layers such as the part connection terminal 84 and the conductor layer 89 by a nickel electroplating and a gold electroplating. Furthermore, the large size ceramic package is divided along the laser division grooves 94 and thereby a plurality of ceramic packages 80 is obtained at once.

BRIEF SUMMARY OF THE INVENTION

In a manufacturing method of a part-mounting package obtained by a multi-cavity technique, the part mounting package includes a substrate base shaped in a plate that has a substrate front surface, a substrate rear surface, and substrate side surfaces and having multilayered structure in which a plurality of insulating layers and a plurality of conductor layers are laminated, a part connection terminal provided to the substrate front surface side to which an electronic part can be connected, and an external connection terminal provided on the substrate rear surface, wherein a side surface recess part including a first recessed region and a second recessed region neighboring the first recessed region is formed in a thickness direction of the substrate base in the substrate side surface, a step is formed at a boundary between the first recessed region and the second recessed region, and an end face through-hole conductor is provided so as to avoid (i.e., not cover) the first recessed region and cover the second recessed region. The manufacturing method of a part-mounting package includes: a sheet preparation process for preparing a plurality of multi-cavity insulating sheets each shaped in a sheet by using an insulating material that is to be the insulating layers; a through-hole forming process for forming a first through-hole in a first insulating sheet (as the insulating sheet) and forming a second through-hole whose opening area is larger than the first through-hole in a second insulating sheet (as the insulating sheet); a conductor forming process for forming a penetration conductor that is to be the end face through-hole conductor to cover an inner surface of the second through-hole and forming the conductor layer on a surface of at least the second insulating sheet of the first insulating sheet and the second insulating sheet; a sheet lamination process for forming a sheet laminated body by laminating the first insulating sheet and the second insulating sheet such that center positions of the first through-hole and the second through-hole are matched to each other; a division groove forming process for forming linear laser division grooves such that the laser division grooves pass through a center of the first through-hole and the second through-hole by applying a laser machining to the sheet laminated body; and a dividing process for dividing the sheet laminated body along the laser division grooves for separation, and causing the side surface recess part and the substrate side surface having the end face through-hole conductor to appear.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

Figure 1:
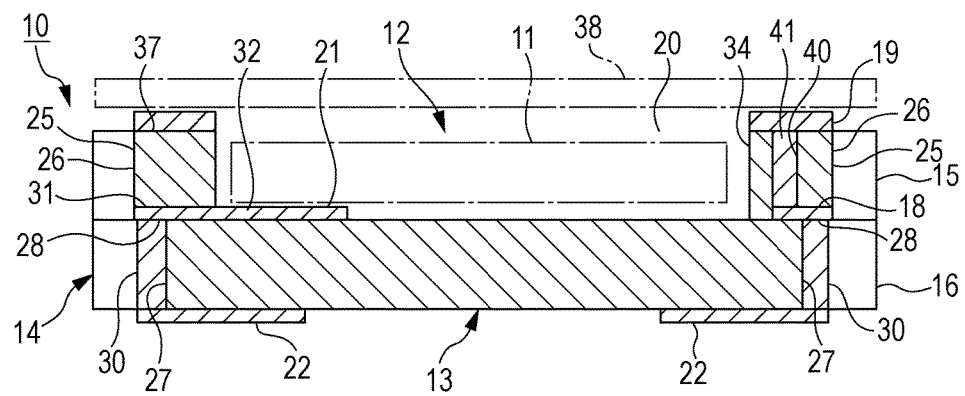
FIG. 1 is a sectional view illustrating a general configuration of a ceramic package in the present embodiment.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 20:
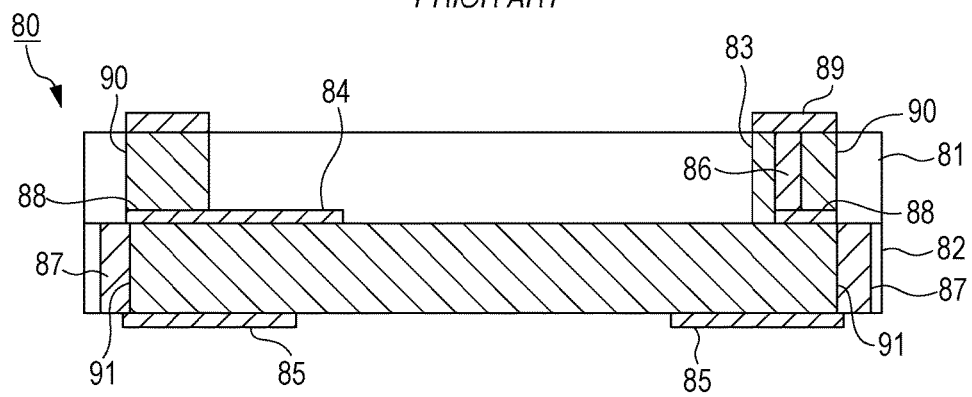
FIG. 20 is a sectional view illustrating a general configuration of a ceramic package of the conventional art.
Figure 21:
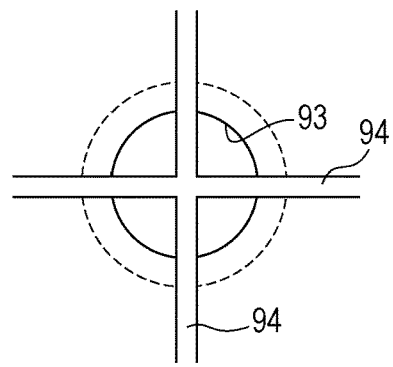
FIG. 21 is a schematic view illustrating the laser division grooves.
Figure 22:
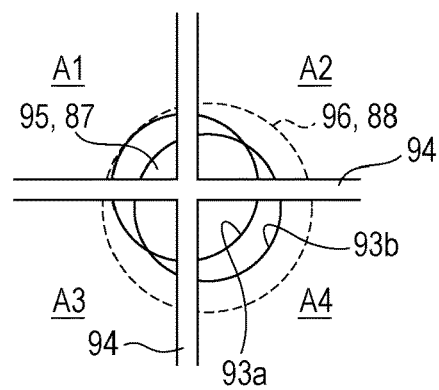
FIG. 22 is a schematic view illustrating the laser division grooves when the lamination misalignment occurs.

As the manufacturing method illustrated in FIG. 20 and FIG. 21, when the division grooves 94 are formed by the laser machining, the plating layer may not sufficiently formed on the metalized conductor layers such as the part connection terminal 84 due to the lamination misalignment of the ceramic green sheets. Specifically, when the division grooves 94 are formed by the laser machining, a part of the conductive paste as the end face through-hole conductor 87 is cut. Therefore, as illustrated in FIG. 22, when the laser division grooves 94 are formed based on, as a reference, the center of the through-hole 93a in the ceramic green sheet in the upper layer side located in the position that is misaligned with respect to the center of the through-hole 93b in the ceramic green sheet in the lower layer side, for example, this results in uneven areas of the end face through-hole conductors 87 after the division. In FIG. 22, the area of the end face through-hole conductor 87 located in the left-upper area A1 is the smallest of four areas A1 to A4 formed after the division by the laser division grooves 94. In this case, a plating current cannot be sufficiently supplied via the end face through-hole conductor 87 which has the small area. Therefore, the plating is less likely to be attached to the part connection terminal 84 and the like.

Figure 23:
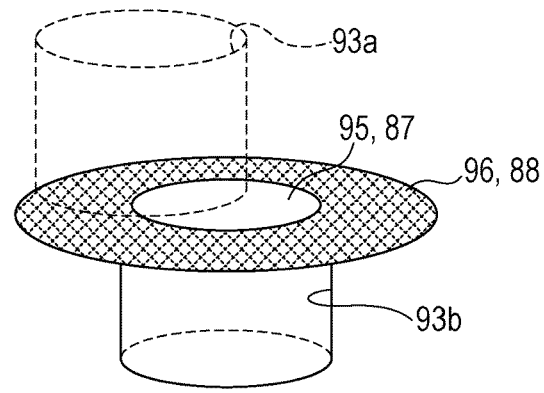
FIG. 23 is a schematic view illustrating a positional relationship of the through-holes when the lamination misalignment occurs.

Further, a conductive paste 96 for the wiring pattern 88 is formed in the interface of the ceramic green sheets in the ceramic green sheet laminated body. Specifically, as illustrated in FIG. 22 and FIG. 23, the conductive paste 96 for the wiring pattern 88 is formed around the through-hole 93b so as to be connected to the conductive paste 95 inside the through-hole 93b (the conductive paste that is to be the end face through-hole conductor 87). When the lamination misalignment of the ceramic green sheets occurs in this ceramic green sheet laminated body as described above, the conductive paste 96 for the wiring pattern 88 is exposed in the through-hole 93a. When the laser machining is applied under this state, the conductive paste 96 for the wiring pattern 88 is cut in the exposed portion. This may result in a disconnection of the conduction between the end face through-hole conductor 87 and the part connection terminal

84. In this case, no current is supplied to the metalized conductor layer of the part connection terminal 84 at the electroplating. Thus, the plating layer cannot be formed on its surface.

The present disclosure has been made in view of the above-described problems and its purpose is to provide a manufacturing method of a part-mounting package by which the connection insufficiency in the end face through-hole conductor is avoided and thus a part-mounting package with a high reliability can be manufactured.

In a method of manufacturing a plurality of part-mounting package obtained by a multi-cavity technique according to an embodiment of the present disclosure (the present manufacturing method), each of the part mounting packages includes a substrate base shaped as a plate having a multi-layered structure in which a plurality of insulating layers and a plurality of conductor layers are laminated. The substrate base includes a substrate front surface, a substrate rear surface, and substrate side surfaces. At least one of the substrate side surfaces defines a side surface recess (also referred to herein as a side surface recess part) including a first recessed region and a second recessed region neighboring (i.e., adjacent to or adjoining) the first recessed region and formed in a thickness direction of the substrate base in the substrate side surface. A step is formed at a boundary between the first recessed region and the second recessed region. Each of the plurality of part-mounting packages further includes a part connection terminal on the substrate front surface to which an electronic part can be connected, an external connection terminal on the substrate rear surface, and an end face through-hole conductor covers the second recessed region and avoids (i.e., does not cover) the first recessed region. The manufacturing method includes: a sheet preparation process of preparing a plurality of multi-cavity insulating sheets, including a first insulating sheet and a second insulating sheet, of an insulating material, each shaped in a sheet by using an insulating material that is to be the insulating layers; a through-hole forming process of forming a first through-hole in the first insulating sheet and forming a second through-hole whose opening area is larger than the first through-hole in the second insulating sheet; a conductor forming process of forming a penetration conductor (that is to be the end face through-hole conductor) to cover an inner surface of the second through-hole and forming a first conductor layer on a surface of the second insulating sheet; a sheet lamination process of laminating the first insulating sheet on the second insulating sheet such that a center of the first through-hole is in alignment with a center of the second through-hole (i.e., center positions of the first through-hole and the second through hole are matched to each other) to form a sheet laminated body; a division groove forming process of laser machining the sheet laminated body to form linear laser division grooves such that the laser division grooves pass through the center of the first through-hole and the center of the second through-hole; and a dividing process of dividing the sheet laminated body along the laser division grooves for separating the sheet laminated body into the plurality of part-mounting packages and exposing a separation surface of each of the plurality of part-mounting packages. The separation surface exposed by the dividing process is the at least one substrate side surface defining the side surface recess and a portion of the penetration conductor exposed by the dividing process is the end face through-hole conductor. In other words, the dividing process causes the side surface recess and the substrate side surface having the end face through-hole conductor to appear.

According to the present manufacturing method, in the dividing process, by dividing and separating the sheet laminated body along the laser division grooves, the part-mounting packages are formed. Then, the substrate side surfaces having the side surface recess part and the end face through-hole conductor appear in the part-mounting package. The side surface recess part of the substrate side surface is formed with the first recessed region and the second recessed region neighboring the first recessed region. The first recessed region is formed by that the first through-hole having a smaller opening area is divided. Further, the second recessed region is formed by that the second through-hole having a larger opening area is divided. Therefore, this results in that the size of the recess part is smaller in the first recessed region and larger in the second recessed region. Further, in the sheet lamination process, the positioning of the center point of the first through-hole and the center point of the second through-hole is performed. Therefore, in the division groove forming process, linear laser division grooves have been formed so as to pass through not only the center of the first through-hole but also the center of the second through-hole. Therefore, the second recessed region formed after the dividing process results in the region that is more recessed than the first recessed region. The side surface recess part having a step at the boundary between the first recessed region and the second recessed region is thus formed. Furthermore, the end face through-hole conductor is provided so as to avoid the first recessed region and cover the second recessed region by that the penetration conductor formed inside the second through-hole is divided. In the present manufacturing method, in the division groove forming process, the end face through-hole conductor is formed with a part of the penetration conductor (a portion corresponding to the laser division grooves) being cut by the laser machining. At this time, the end face through-hole conductor has been formed in the second recessed region having the larger size. Thus, even when the occurrence of the lamination misalignment between the insulating sheets in the sheet lamination process results in that the forming position of the laser division grooves are misaligned from the center of the through-hole, the sufficient connection area of the end face through-hole conductor can be ensured. As a result, the connection insufficiency in the end face through-hole conductor is avoided, so that the part-mounting package that is superior in the reliability can be manufactured.

The insulating layers forming the substrate base may be ceramic insulating layers, and the conductor layers may be metalized conductor layers. In this case, in the sheet preparation process, a first unfired ceramic sheet and a second unfired ceramic sheet shaped in a sheet by using an unfired ceramic material are prepared as the first insulating sheet and the second insulating sheet. Further, in the conductor forming process, an unfired penetration conductor that is to be the end face through-hole conductor is formed inside the second through-hole in the second unfired ceramic sheet, and unfired conductor layers (as the metalized conductor layers) are formed on the respective surfaces of the first unfired ceramic sheet and the second unfired ceramic sheet. Then, by performing the sheet lamination process described above, a sheet laminated body including the laminated first unfired ceramic sheet and second unfired ceramic sheet is formed. Then, in the ceramic firing process, a ceramic fired material is obtained by firing this sheet laminated body.

The above-described division groove forming process may be performed at any timing before or after the ceramic firing process. Specifically, when, for example, the part-mounting package (the substrate base) is thick, the division groove forming process may be performed after the sheet lamination process and before the ceramic firing process. Thereby, the laser division grooves are formed on the surface of the sheet laminated body. In this case, the sheet laminated body has not yet been fired and is still soft. Therefore, the laser division grooves having the depth depending on the thickness of the part-mounting package can be relatively easily formed. Further, when the part-mounting package (the substrate base) is thin, the division groove forming process may be performed after the ceramic firing process. Thereby, the laser division grooves are formed on the surface of the ceramic fired material (the fired sheet laminated body). When the part-mounting package is thin, if the laser division grooves are formed before the ceramic firing process, the strength of the sheet laminated body is insufficient. As a result, there is a concern of a problem that the yield rate decreases due to the crack in the sheet laminated body at the portion of the laser division grooves, which requires very careful handling of the sheet laminated body. In contrast, when the division grooves are formed after the ceramic firing process, the strength of the sheet laminated body can be ensured. Thus, the handleability of the sheet laminated body is improved. As a result, the decrease in the product yield rate can be avoided.

In the conductor forming process, an unfired conductor layer as the part connection terminal may be formed. Further, this unfired conductor layer may be an unfired conductor layer as the wiring metalized conductor layer for electrically connecting the part connection terminal and the end face through-hole conductor. Further, in this case, a metallization plating process may be performed after the ceramic firing process. In this metallization plating process, a current is supplied to the metalized conductor layer of the part connection terminal via the metalized conductor layer, which is to be the end face through-hole conductor, and the wiring metalized conductor layer, and a plating layer is formed on the metalized conductor layer of the part connection terminal by an electroplating. In this way, forming the plating layer on the metalized conductor layer allows for the enhancement of the connection reliability between the part connection terminal and the electronic parts.

As described above, when the plating layer is formed on the part connection terminal, formed is the wiring conductor layer (the unfired conductor layer as the wiring patterns for the plating) for connecting the end face through-hole conductor and the part connection terminal. Here, if the diameter of the first through-hole formed in the first unfired ceramic sheet is equal to the diameter of the second through-hole formed in the second unfired ceramic sheet and if the lamination misalignment occurs at the lamination of these ceramic sheets, the wiring conductor layer is exposed in the first through-hole. This causes a concern that, at the forming of the laser division grooves, the laser is irradiated on the exposed conductor layer and thus a part of the conductor layer is lost. In this case, the sufficient plating current is not supplied to the metalized conductor layer of the part connection terminal via the wiring conductor layer and thus the plating is not attached onto the metalized conductor layer. In contrast, in the present manufacturing method, the size of the second through-hole is larger than the size of the first through-hole. Thus, even when the lamination misalignment occurs, it is avoided that the wiring conductor layer (the unfired conductor layer or the metalized conductor layer) is exposed in the first through-hole. Thus, the problem of the loss of the wiring conductor layer due to the laser machining can be avoided. As a result, the sufficient plating current can be supplied to the metalized conductor layer of the part connection terminal via the wiring metalized conductor layer. As a result, this allows for ensuring to form the plating layer on that metalized conductor layer.

In the division groove forming process, the laser division grooves may be formed such that they intersect at the center of each through-hole. In this case, the first recessed region and the second recessed region obtained by dividing each through-hole are each shaped in a quarter arc. Further, the substrate base is formed in the shape of a rectangle plate, and the end face through-hole conductors are formed at four corners in the substrate base. The end face through-hole conductor may be formed in an edge connecting the corners of the substrate base. In this case, the first recessed region and the second recessed region are each shaped in a half arc.

In the through-hole forming process, a third through-hole as a cavity may be formed in addition to the first through-hole and the second through-hole as the side surface recess parts. It is noted that the cavity is a non-penetrating recess part in which an electronic part can be mounted.

The part-mounting package may have an arc-shaped conductor layer that is pattern-formed along the recess shape of the edge of the second recessed region to be connected to the end face through-hole conductor as the conductor layer of the internal layer provided between the insulating layers, and a wiring conductor layer that is pattern-formed to connect the arc-shaped conductor layer and the part connection terminal. In the present manufacturing method, the size of the recess part of the second recessed region is larger than the size of the recess part of the first recessed region. Thus, even when the lamination misalignments among a plurality of insulating layers occur, neither the arc-shaped conductor layer nor the wiring conductor layer is exposed at the portion of the step at the boundary between the first recessed region and the second recessed region. Thus, the problem that the exposed portion of the wiring conductor layer is cut due to the laser machining can be avoided. This allows the current to be ensured to flow to the part connection terminal via the arc-shaped conductor layer and the wiring conductor layer, so that the sufficient thickness of the plating layer can be formed on the part connection terminal by the electroplating.

The substrate base may have a cavity as the non-penetrating recess part in which an electronic part can be mounted and a sealing conductor layer provided to surround the cavity in the outer periphery of the cavity. Further, provided may be a through-hole conductor connected to the sealing conductor layer at the corner of the substrate base, and the first recessed region and the second recessed region located closer to the outer periphery of the substrate than the forming position of the through-hole conductor. Such a positional relationship between the through-hole conductor and the recessed region allows for ensuring to form the through-hole conductor and the end face through-hole conductor of the second recessed region.

When the first recessed region and the second recessed region each are a region recessed in the shape of a quarter arc or a half arc, the radius of curvature of the second recessed region is 1.2 times to 2.0 times larger than the radius of curvature of the first recessed region. Further, in this case, the radius of curvature of the second recessed region is larger than or equal to 100 μm and smaller than or equal to 200 μm. This allows for ensuring a sufficient connection area of the end face through-hole conductor formed in the second recessed region, so that the connection reliability of the part-mounting package can be enhanced. Further, the sizes of the side surface recess parts (the first recessed region and the second recessed region) do not become larger than is necessary. This allows for the reduction in the size of the package.

When the cavity is provided in the substrate base, the part connection terminal is provided on the bottom of the cavity. Further, a lid member for sealing the cavity is joined to the sealing conductor layer by a welding. This allows for ensuring that the electronic part is accommodated in the cavity.

The length of the second recessed region in the thickness direction of the substrate base (the lamination direction of the insulating layers) may be shorter than or longer than the length of the first recessed region. When the width of the wall part formed around the cavity (the frame width) is narrow, the stress concentration at the corner in the uppermost layer can be reduced in the substrate base by that the length of the second recessed region is shorter than that of the first recessed region.

With respect to the part-mounting package manufactured by the present manufacturing method, the electronic part to be connected to the part connection terminal may include quartz devices such as a quartz resonator, a quartz oscillator, and a quartz filter. Furthermore, the electronic part may be a semiconductor device, a piezoelectric oscillator, and so on other than the quartz devices.

Figure 2:
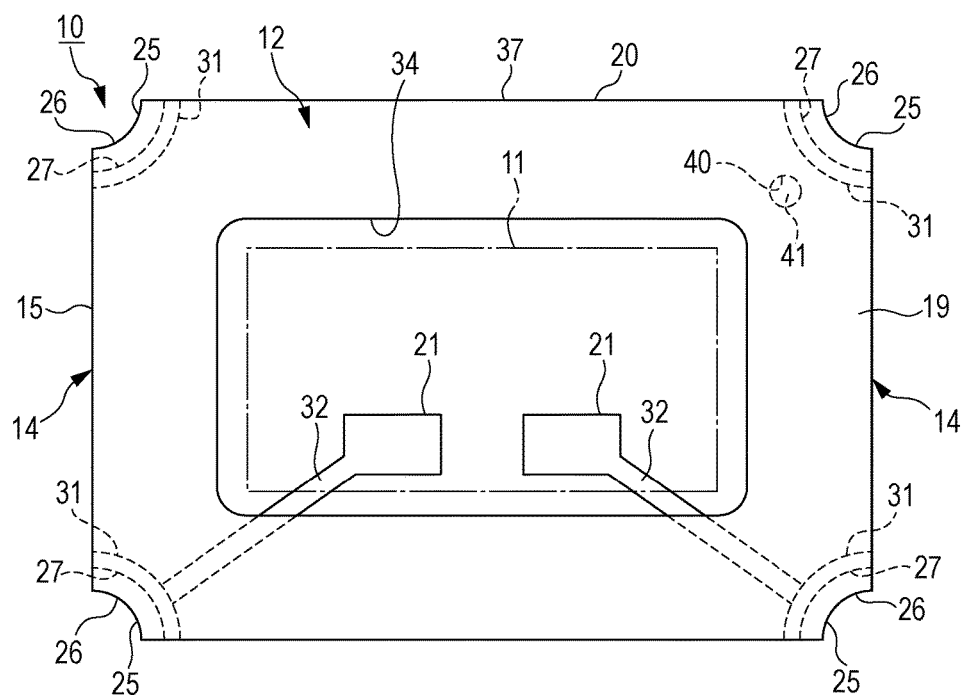
FIG. 2 is a top view illustrating the ceramic package.

In the followings, a specific manufacturing method of the ceramic package according to one embodiment of the present disclosure will be described in detail based on the drawings. FIG. 1 is a sectional view illustrating a general configuration of the ceramic package in the present embodiment. FIG. 2 is a top view illustrating the ceramic package.

As illustrated in FIG. 1 and FIG. 2, a ceramic package 10 manufactured by the method according to the present embodiment is a part-mounting package for mounting a quartz oscillator 11 therein as an electronic part. This ceramic package 10 is a rectangle flat plate-like member, and its size is, for example, length 0.8 mm×width 1.2 mm×height 0.5 mm. In more detail, the ceramic package 10 manufactured according to the present embodiment has a rectangle plate-like substrate base 20. Further, the substrate base 20 has a substrate front surface 12, a substrate rear surface 13, and substrate side surfaces 14. The substrate base 20 has multilayer structure including a plurality of ceramic insulating layers 15 and 16 made of a ceramic material and a plurality of conductor layers 18 and 19 formed of metalized conductor layers. Each of the ceramic insulating layers 15 and 16 is made of an alumina sintered material. The conductor layers 18 and 19 have layers containing tungsten, molybdenum, or an alloy thereof, for example. It is noted that the ceramic package 10 of the present embodiment has the structure including two laminated ceramic insulating layers. However, multilayer structure including three or more laminated ceramic insulating layers may be employed.

Furthermore, the ceramic package 10 has part connection terminals 21 and external connection terminals 22. The part connection terminals 21 are provided in the substrate front surface 12 side in the substrate base 20. The quartz oscillator 11 can be connected to the part connection terminals 21. The external connection terminals 22 are provided on the substrate rear surface 13. The external connection terminals 22 are connected to the external substrate (depiction is omitted). The part connection terminals 21 and the external connection terminals 22 include a metalized conductor layer and a plating layer (for example, a nickel plating layer or a gold plating layer) covering the surface thereof. The ceramic package 10 manufactured by the method according to the present embodiment is a package obtained by a multi-cavity technique. The substrate side surfaces 14 of the substrate base 20 are side surfaces that are resulted after the multi-cavity substrate is divided along laser division grooves.

Figure 3:
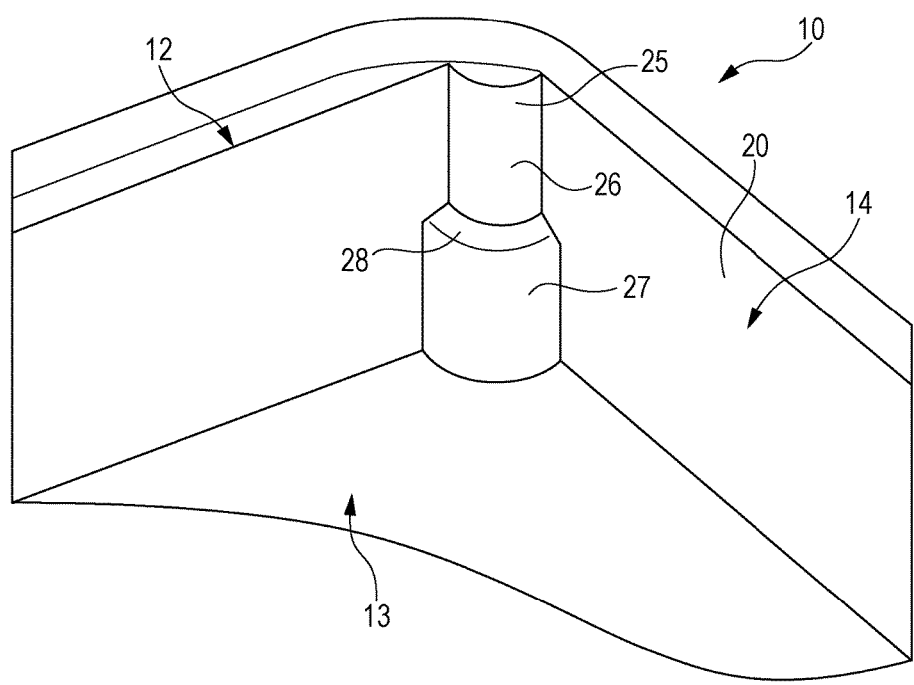
FIG. 3 is an oblique view illustrating a side surface recess part.

As illustrated in FIG. 1 and FIG. 2, side surface recess parts 25 are formed in four corners of the substrate side surfaces 14 of the substrate base 20, respectively. As illustrated in FIG. 3, each side surface recess part 25 includes a first recessed region 26 and a second recessed region 27 neighboring the first recessed region 26 in a thickness direction of the substrate base 20. A step 28 is formed at the boundary of the first recessed region 26 and the second recessed region 27. It is noted that FIG. 3 is an oblique view of the side surface recess part 25 viewed from the substrate rear surface 13 side. Each of the first recessed region 26 and the second recessed region 27 is a portion recessed in the shape of a quarter arc. These recessed regions function as the recess parts for a chamfering (chamfering recess parts) at the corner. In the present embodiment, the radius of curvature of the second recessed region 27 is approximately 1.5 times larger than the radius of curvature of the first recessed region 26. That is, when viewed from the direction parallel to the plane of the substrate base 20, the second recessed region 27 in the side surface recess part 25 is located closer to the substrate center than the first recessed region 26.

Specifically, the radius of curvature of the first recessed region 26 is approximately 80 μm and the radius of curvature of the second recessed region 27 is approximately 120 μm. For a larger package size, the radius of curvature of the first recessed region 26 may be changed to 100 μm and further the radius of curvature of the second recessed region 27 may be changed to 150 μm to form the side surface recess part 25. As illustrated in FIG. 1, in the ceramic package 10 manufactured by the method according to the present embodiment, end face through-hole conductors 30 (castellation) are provided so as to avoid the first recessed regions 26 and cover the second recessed regions 27 in the side surface recess parts 25. That is, the end face through-hole conductors 30 are provided so as to cover the second recessed regions 27 only, which have the larger recess part size than the first recessed regions 26 in the side surface recess parts 25. Each end face through-hole conductor 30 includes a metalized conductor layer and a plating layer (for example, a nickel plating layer or a gold plating layer) covering the surface thereof. It is noted that FIG. 3 illustrates the side surface recess part 25 where the end face through-hole conductor 30 has been removed from the second recessed region 27.

As illustrated in FIG. 1 and FIG. 2, the conductor layer 18 of the internal layer formed between the ceramic insulating layers 15 and 16 in the substrate base 20 includes arc-shaped conductor layers 31 and linear conductor layers 32. The arc-shaped conductor layers 31 are pattern-formed along the recess shape at the edges of the second recessed regions 27 such that the conductor layers 31 are connected to the end face through-hole conductors 30 covering the second recessed regions 27. Further, the linear conductor layers 32 are conductor layers for wirings. The linear conductor layers 32 are pattern-formed such that the conductor layers 32 connect the arc-shaped conductor layers 31 and the part connection terminals 21.

The ceramic package 10 includes a cavity 34 formed opened in the substrate front surface 12 (the top face in FIG. 1) of the substrate base 20. The cavity 34 is a non-penetrating recess part in which the quartz oscillator 11 can be mounted. The part connection terminals 21 are provided on the bottom of the cavity 34. Further, a part of the wiring conductor layers 32 connected to the external connection terminals 22 is exposed in the bottom of the cavity 34.

In the surface of the ceramic insulating layer 15 in the upper layer side in the substrate base 20, a sealing conductor layer 19 is formed. The sealing conductor layer 19 is provided in the outer periphery of the cavity 34 so as to surround that cavity 34. That is, the sealing conductor layer 19 is formed on the upper end face of a wall part 37 (a frame) formed around the cavity 34. The wall part 37 of the cavity 34 is formed by the ceramic insulating layer 15 in the upper layer side. A lid member 38 for sealing the cavity 34 is joined to the sealing conductor layer 19 by a welding such as a brazing.

In the ceramic package 10, the ceramic insulating layer 15 in a predetermined corner of the substrate base 20 (the right-upper corner in FIG. 2) is formed with a through-hole 40 penetrating it in its thickness direction. Inside the through-hole 40, a through-hole conductor 41 connected to the sealing conductor layer 19 is formed. In the ceramic package 10 manufactured by the method according to the present embodiment, the first recessed region 26 and the second recessed region 27 of the side surface recess part 25 are arranged closer to the outer periphery of the substrate than the forming position of the through-hole conductor 41 in the corner of the substrate base 20.

Next, a manufacturing method of the ceramic package 10 according to the present embodiment will be described.

Figure 4:
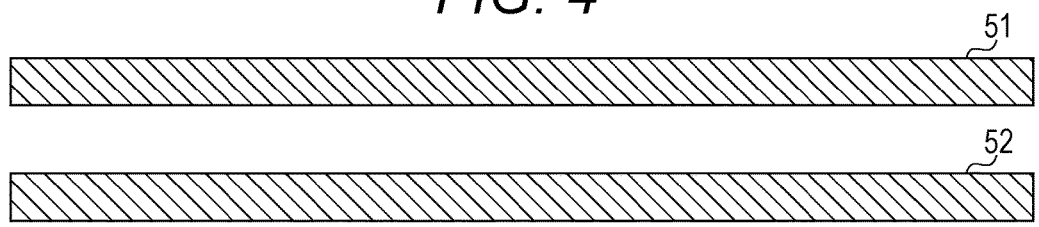
FIG. 4 is a schematic view illustrating a sheet preparation process.

First, a slurry is fabricated by mixing alumina powder as an unfired ceramic material (an insulating material), an organic binder, a solvent, a plasticizer, and so on. This slurry is then molded in a sheet shape by a conventional known technique (for example, a doctor blade method or a calendering roll method). In this way, two ceramic green sheets 51 and 52 are fabricated as the multi-cavity insulating sheet (see FIG. 4). Here, prepared are a first ceramic green sheet 51 (a first unfired ceramic sheet) as the ceramic insulating layer 15 of the upper layer side and a second ceramic green sheet 52 (a second unfired ceramic sheet) as the ceramic insulating layer 16 of the lower layer side (a sheet preparation process).

Figure 5:
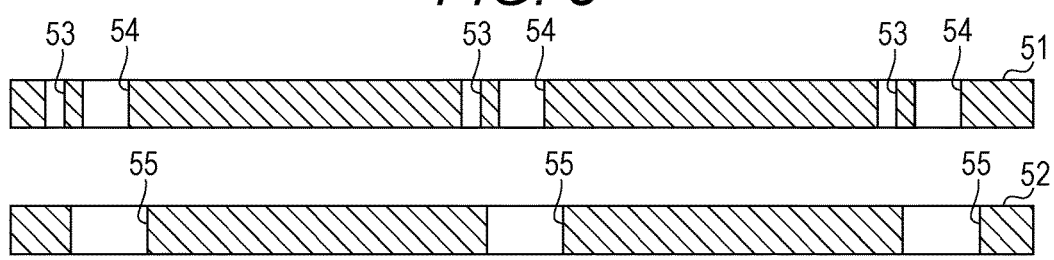
FIG. 5 is a schematic view illustrating a through-hole forming process.

Then, in a through-hole forming process, a punching (a stamping) is performed to form through-holes 53, 54, and 55 penetrating the ceramic green sheets 51 and 52 in their thickness direction at a plurality of positions of each of the ceramic green sheets 51 and 52 (see FIG. 5). It is noted that the through-holes 53, 54, and 55 may be formed by other technique than the punching, such as a laser drilling. In the first ceramic green sheet 51, the through-holes 53 are through-holes for forming the through-hole conductors 41. The through-holes 54 are first through-holes for forming the first recessed regions 26 of the side surface recess parts 25. Further, the through-holes 55 in the second ceramic green sheet 52 are second through-holes for forming the second recessed regions 27 of the side surface recess parts 25. The second through-hole 55 has a larger opening area than the first through-hole 54 (specifically, the diameter is approximately 1.5 times larger).

Figure 6:
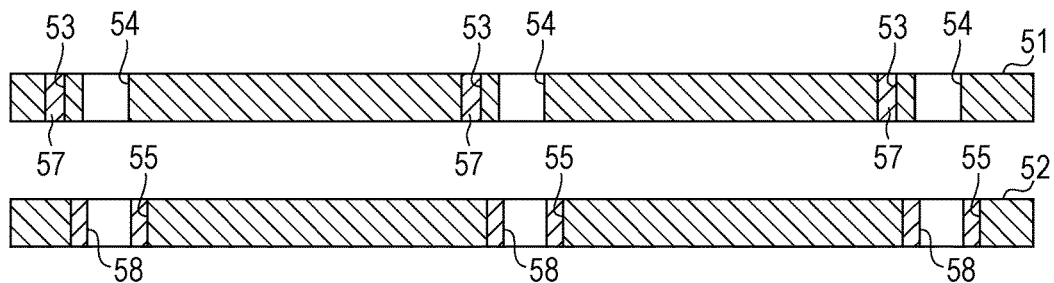
FIG. 6 is a schematic view illustrating a conductor forming process.

Then, penetration conductors 57 and 58 are formed inside the through-holes 53 of the first ceramic green sheet 51 and inside the through-holes 55 of the second ceramic green sheet 52, respectively (a conductor forming process). More specifically, first, a conventional known paste printing apparatus is used to fill the insides of the through-holes 53 of the first ceramic green sheet 51 with a conductive paste containing tungsten or molybdenum. Thereby, the unfired penetration conductors 57 as the through-hole conductors 41 are formed (see FIG. 6). That is, the unfired penetration conductors 57 are formed so that the through-holes 53 are completely filled with the conductive paste. Subsequently, a castellation printing is performed to cause the conductive paste containing tungsten or molybdenum to be attached to the inner surfaces of the through-holes 55 of the second ceramic green sheet 52. In this way, the unfired penetration conductors 58 as the end face through-hole conductors 30 covering the inner surfaces of the through-holes 55 are formed (see FIG. 6). Therefore, it is not always necessary for the insides of the through-holes 55 to be completely filled with the conductive paste. In FIG. 6, the center part of the unfired penetration conductor 58 is hollow.

Figure 7:
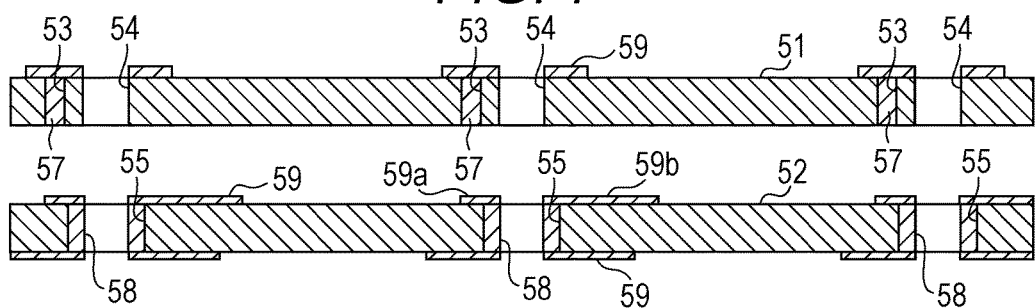
FIG. 7 is a schematic view illustrating the conductor forming process.
Figure 8:
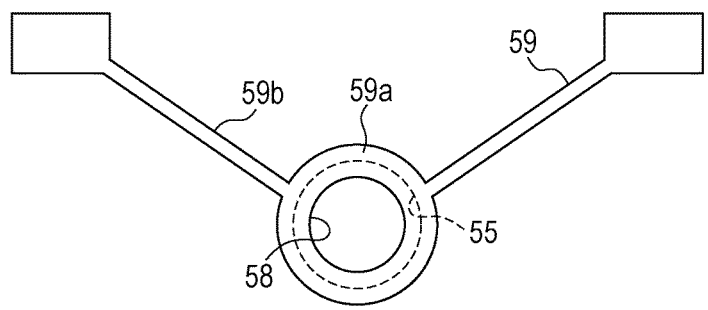
FIG. 8 is a schematic view illustrating the conductor forming process.

Next, unfired conductor layers 59 are formed on each surface of the ceramic green sheets 51 and 52 by a screen printing method (see FIG. 7). It is noted here that the conductive paste is printed by using a mask (depiction is omitted) on the each surface of the ceramic green sheets 51 and 52. Thereby, the unfired conductor layers 59 are pattern-formed. These unfired conductor layers 59 form the metalized conductor layers such as the conductor layer 18 of the internal layer, the sealing conductor layer 19, the part connection terminals 21, and the external connection terminals 22. It is noted that the unfired conductor layer 59 as the conductor layer 18 of the internal layer includes the conductor layers (a circular unfired conductor layer 59a and a linear unfired conductor layer 59b corresponding to each of the conductor layers 31 and 32) forming the wiring metalized conductor layer for electrically connecting the part connection terminals 21 and the end face through-hole conductors 30 (see FIG. 8).

Figure 9:
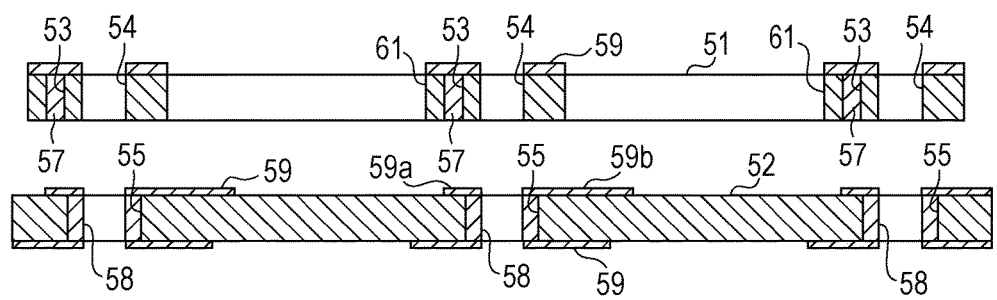
FIG. 9 is a schematic view illustrating a cavity through-hole forming process.

In this way, after the unfired conductor layers 59 are formed, the unfired penetration conductors 57 and 58 and the unfired conductor layers 59 formed on the ceramic green sheets 51 and 52 are dried by heating them up to a predetermined temperature. In the subsequent cavity through-hole forming process, a punching is performed by using a punching tool (depiction is omitted). Thereby, a through-hole 61 (a third through-hole) as the cavity 34 is formed in the first ceramic green sheet 51 (see FIG. 9).

Figure 10:
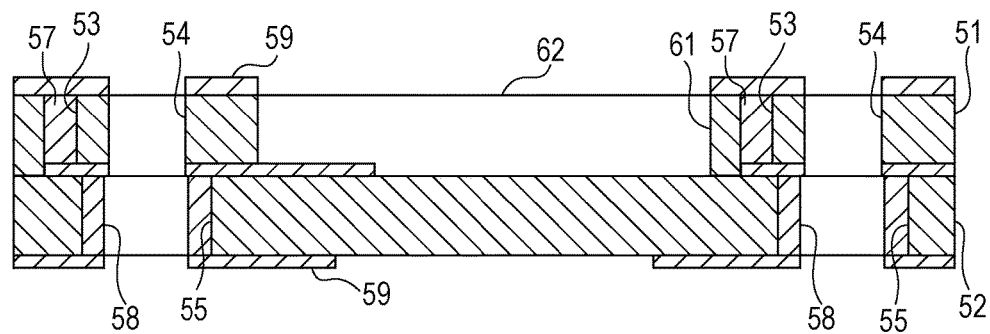
FIG. 10 is a schematic view illustrating a sheet lamination process.
Figure 11:
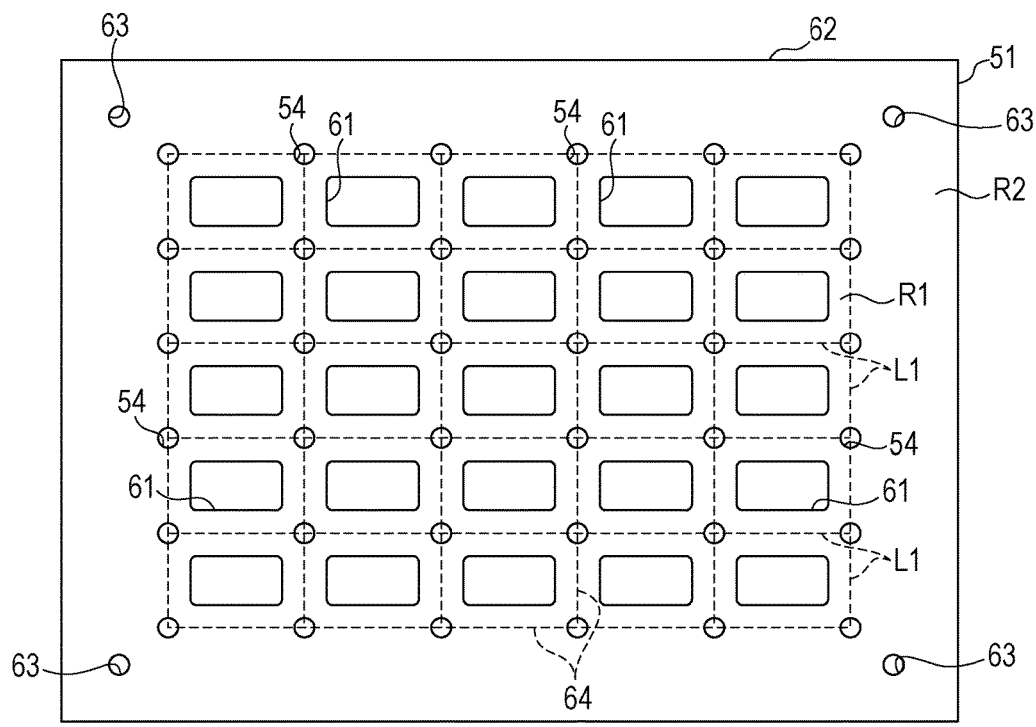
FIG. 11 is a top view illustrating a ceramic green sheet laminated body.

Then, a sheet lamination process is performed. In this process, the first ceramic green sheet 51 is laminated on the second ceramic green sheet 52 so that the center positions of the through-holes 54 and the center positions of the through-holes 55 overlap to each other. A predetermined weight is applied to these ceramic green sheets in the thickness direction to crimp them by using a conventional known laminating apparatus. As a result, an integrated ceramic green sheet laminated body 62 (an unfired sheet laminated body) is formed (see FIG. 10). In the present embodiment, as illustrated in FIG. 11, alignment through-holes 63 are formed in four corners in an outer region R2 of a product region R1 in each of the ceramic green sheets 51 and 52. The positioning of each of the ceramic green sheets 51 and 52 is performed based on the positions of each of the through-holes 54 and 55 by identifying these alignment through-holes 63 on an image taken by a camera.

Figure 12:
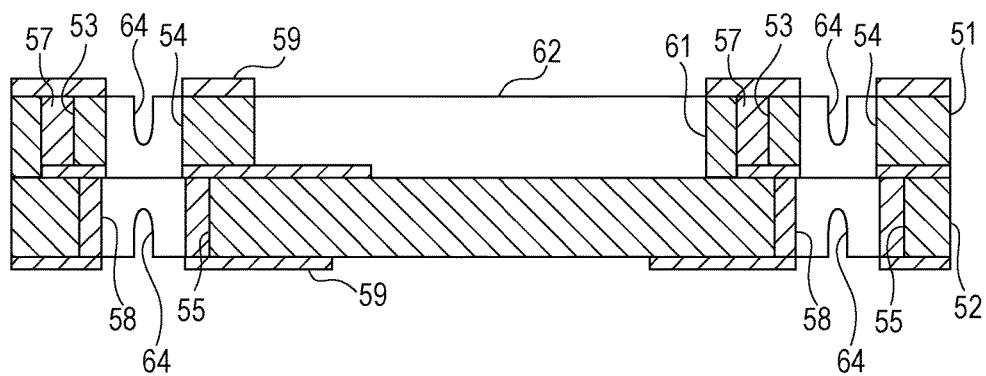
FIG. 12 is a schematic view illustrating a division groove forming process.
Figure 13:
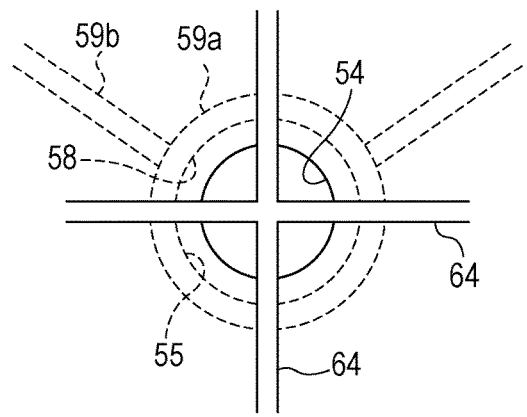
FIG. 13 is a schematic view illustrating the division groove forming process.

In a subsequent division groove forming process, a laser machining is applied to the ceramic green sheet laminated body 62 by laser irradiation using a laser machining apparatus. In this process, a plurality of laser division grooves 64 is formed in a grid pattern in the front surface and the rear surface of the ceramic green sheet laminated body 62 along outlines L1 in the product region R1 (see FIG. 11 and FIG. 12). Here, as illustrated in FIG. 12 and FIG. 13, the division grooves 64 are formed so that two linear laser division grooves 64 intersect at the center of the first through-hole 54 and the center of the second through-hole 55. In the present embodiment, the width of the laser division groove 64 is approximately 30 μm. Further, during the laser division grooves 64 being formed, machining chips caused by the laser irradiation are removed by using a not-shown suction apparatus or blowing apparatus.

Figure 14:
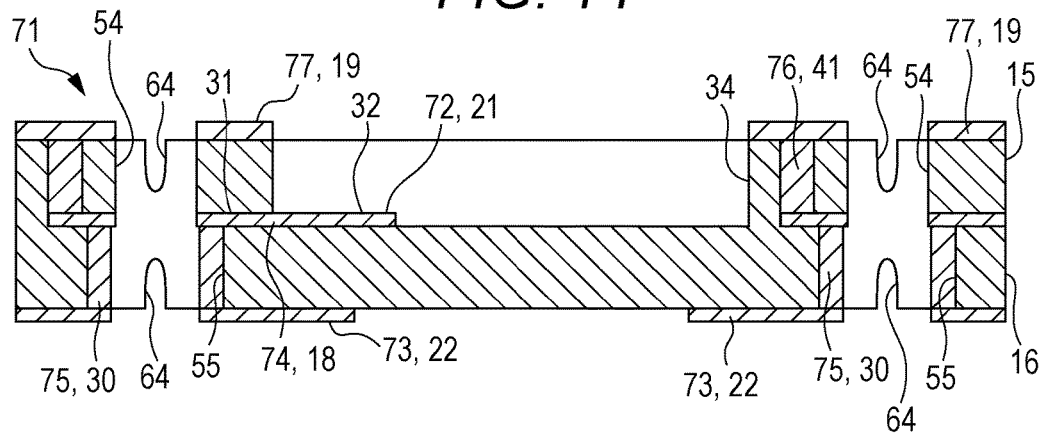
FIG. 14 is a schematic view illustrating a ceramic package after a ceramic firing process.

In the ceramic firing process after the division groove forming process, the ceramic green sheet laminated body 62 is heated at a predetermined temperature (for example, a temperature around 1500 degrees centigrade to 1800 degrees centigrade) at which alumina can be sintered. Each of the ceramic green sheets 51 and 52 of the ceramic green sheet laminated body 62 is sintered through this firing, so that a large size ceramic package 71 (a ceramic fired body that is a fired sheet laminated body) is obtained (see FIG. 14). Further, as illustrated in FIG. 14, metalized conductor layers 72 to 77 such as the part connection terminals 21, the external connection terminals 22, the conductor layer 18 of the internal layer, the end face through-hole conductors 30, the through-hole conductor 41, and the sealing conductor layer 19 are formed by the sintering of the conductive paste. It is noted that the ceramic package 71 obtained here is a multi-cavity package having the structure including a plurality of product regions R1 as the ceramic packages 10 aligned vertically and horizontally on a flat face.

Furthermore, a plating layer is formed on the surfaces of the metalized conductor layers 72 to 75 and 77 such as the part connection terminals 21, the external connection terminals 22, and the sealing conductor layer 19 of the ceramic package 71 by applying an electroplating thereon (a metalizing plating process). In this plating process, a current is supplied to the metalized conductor layer 72 of the part connection terminals 21 via the metalized conductor layer 75 as the end face through-hole conductors 30 and the wiring metalized conductor layer 74. As a result, the plating layer is formed on the metalized conductor layer 72 of the part connection terminal 21 by the electroplating. Further, at this time, a current is supplied also to the metalized conductor layers 73 and 77 as the external connection terminals 22 and the sealing conductor layer 19 and to the metalized conductor layer 74 as the linear conductor layers 32 exposed at the cavity 34. In this way, the plating layer is formed on these metalized conductor layers 73, 74, and 77 by the electroplating.

In the dividing process, the ceramic package 71 is then divided along the laser division grooves 64 and the ceramic package 71 is thus separated. Thereby, a plurality of ceramic packages 10 of FIG. 1 is obtained at the same time. It is noted that the laser division grooves 64 are formed so as to pass through the center of the through-holes 54 and the center of the through-holes 55 having the metalized conductor layer 75. Thus, dividing the ceramic package 71 along the laser division grooves 64 results in that the substrate side surface 14 having the side surface recess part 25 and the end face through-hole conductor 30 appears in each corner of the ceramic package 10.

Figure 15:
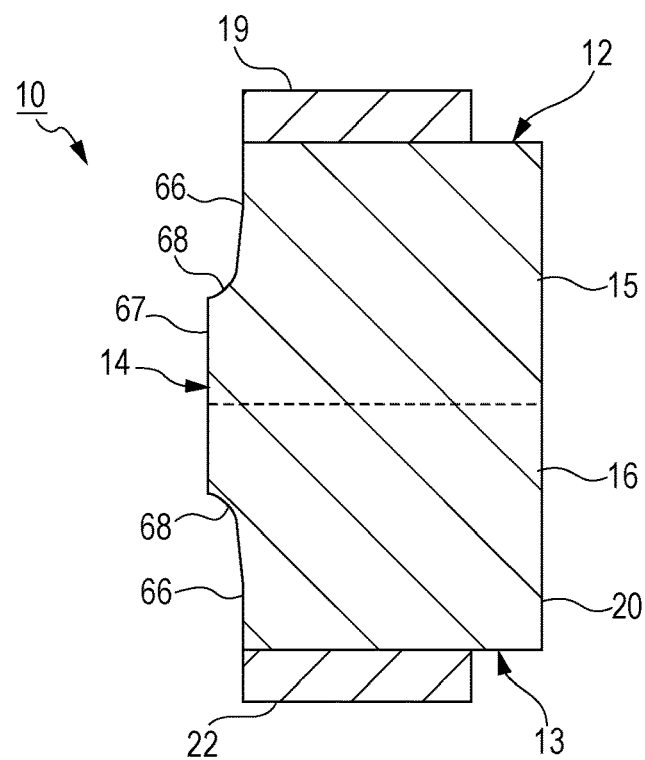
FIG. 15 is a sectional view illustrating a machined surface and a fractured surface in a substrate side surface.

As illustrated in FIG. 15, the substrate side surface 14 as the division surface of the ceramic package 10 can be sectioned into machined surfaces 66 formed by the cut and removal by the laser machining and a fractured surface 67 formed by the breakage by the dividing process. In the ceramic package 10 manufactured by the method according to the present embodiment, steps 68 of approximately ten and a few μm are formed at the boundaries between the machined surfaces 66 and the fractured surface 67. In contrast, if the division grooves of the ceramic package are formed by using a blade, smooth surfaces without unevenness is formed at the boundaries between the machined surfaces 66 and the fractured surface 67 and thus substantially no step 68 is formed. That is, in the ceramic package 10 manufactured by the method according to the present embodiment, the steps 68 between the machined surfaces 66 and the fractured surface 67 are larger compared to the case where the division grooves were formed by the blade. Therefore, by identifying the steps 68 between the machined surfaces 66 and the fractured surface 67 in the substrate side surface 14, it is possible to determine whether or not the division grooves 64 formed in the manufacturing process of the ceramic package 10 is made by the laser machining.

Therefore, the following advantages can be obtained according to the present embodiment.

Figure 16:
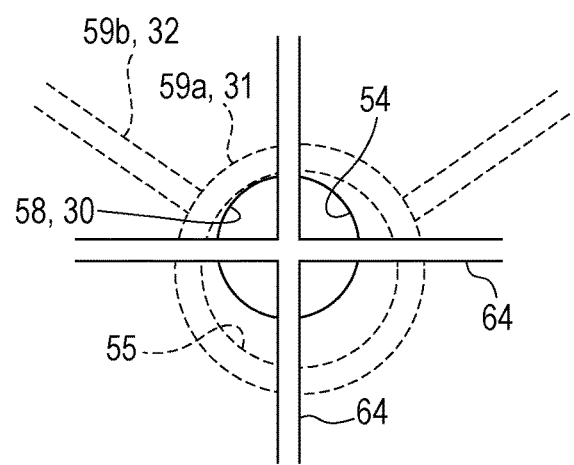
FIG. 16 is a schematic view illustrating laser division grooves when there is a lamination misalignment.

(1) In the present embodiment, the ceramic package 71 is divided along the laser division grooves 64 and the ceramic package 71 is thus separated. Thereby, the part-mounting ceramic packages 10 are formed. Then, in the ceramic package 10, the substrate side surfaces 14 having the side surface recess parts 25 and the end face through-hole conductors 30 appear. The first recessed regions 26 of the side surface recess parts 25 are formed by dividing the first through-holes 54 each having the smaller opening area. The second recessed regions 27 are formed by dividing the second through-holes 55 each having the larger opening area. Therefore, the second recessed region 27 is a region that is more recessed than the first recessed region 26. Thus, the side surface recess part 25 having the step 28 is formed by the first recessed region 26 and the second recessed region 27. Furthermore, in the present embodiment, the end face through-hole conductor 30 is formed in a state where a part of the penetration conductor 58 (a portion corresponding to the laser division groove 64) is cut and removed by the laser machining in the division groove forming process. Here, the end face through-hole conductor 30 is formed in the second recessed region 27 having the larger size. Thus, even when the lamination misalignment of each of the ceramic green sheets 51 and 52 occurs in the sheet lamination process and thereby the forming position of the laser division grooves 64 is misaligned from the center of the through-hole 54 or the center of the through-hole 55 (see FIG. 16), the sufficient connection area of the end face through-hole conductor 30 can be ensured. As a result, the connection insufficiency in the end face through-hole conductor 30 is avoided, so that the ceramic package 10 with a superior reliability can be manufactured.

(2) In the present embodiment, the division groove forming process is performed after the sheet lamination process and before the ceramic firing process. In this division groove forming process, the laser division grooves 64 are formed by applying the laser machining on the surface of the ceramic green sheet laminated body 62. In this case, the ceramic green sheet laminated body 62 has not yet been fired and thus is soft. Therefore, the laser division grooves 64 having a depth depending on the thickness of the ceramic package 10 are relatively easily formed.

(3) In the ceramic package 10 manufactured by the method according to the present embodiment, the wiring conductor layers 31 and 32 for connecting the end face through-hole conductor 30 and the part connection terminal 21 are formed as the conductor layer that is to be the wiring pattern for the plating. In the present embodiment, the second through-hole 55 formed in the ceramic green sheet 52 has a larger size than the first through-hole 54 formed in the ceramic green sheet 51. Thus, even when a lamination misalignment occurs, it is avoided that the wiring conductor layers 31 and 32 (the unfired conductor layers 59*a* and 59*b*) are exposed in the first through-hole 54 (see FIG. 16). Therefore, the problem of the loss of the unfired conductor layers 59*a* and 59*b* due to the laser machining can be avoided. As a result, the sufficient plating current can be supplied to the metalized conductor layer 72 and the like as the part connection terminals 21 via the metalized conductor layer 74 and the like as the wiring conductor layers 31 and 32. This allows for ensuring that the plating layer is formed on that metalized conductor layer 72.

(4) In the ceramic package 10 manufactured by the method according to the present embodiment, the through-hole conductor 41 connected to the sealing conductor layer 19 is provided in the corner of the substrate base 20. Further, the first recessed region 26 and the second recessed region 27 are arranged closer to the outer periphery of the substrate than the forming position of the through-hole conductor 41. Such the positional relationship between the through-hole conductor and the recessed regions allows for ensuring to form the through-hole conductor 41 connected to the sealing conductor layer 19, and the end face through-hole conductor 30 of the second recessed region 27.

It is noted that the embodiments of the present disclosure may be modified as follows.

Figure 17:
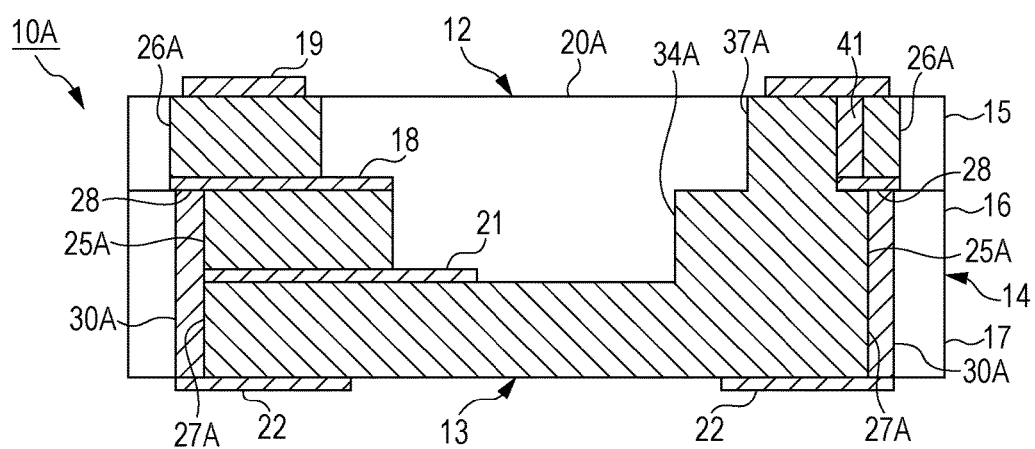
FIG. 17 is a sectional view illustrating a general configuration of a ceramic package in another embodiment in which a second recessed region is longer than a first recessed region.

Although the ceramic package 10 manufactured by the method according to the above-described embodiment is formed such that the length in the lamination direction (the thickness direction of the substrate base 20) of the second recessed region 27 in which the end face through-hole conductor 30 is formed is substantially the same as the first recessed region 26 in the side surface recess part 25 of the substrate base 20, it is not limited to it. As a ceramic package 10A illustrated in FIG. 17, side surface recess parts 25A may be formed such that the length of a second recessed region 27A in the lamination direction of the ceramic insulating layers 15, 16, and 17 is longer than the length in the same direction of a first recessed region 26A. In the ceramic package 10A of FIG. 17, a rectangle plate-like substrate base 20A is formed by the lamination of three ceramic insulating layers 15, 16, and 17, and the side surface recess part 25A is formed in the substrate side surface 14 in each corner. A cavity 34A opened to the substrate front surface 12 side and having a step is formed in the substrate base 20A. In the substrate base 20A, the length of the second recessed region 27A in which an end face through-hole conductor 30A is formed is a length corresponding to the thickness for two layers of the ceramic insulating layers 16 and 17.

Figure 18:
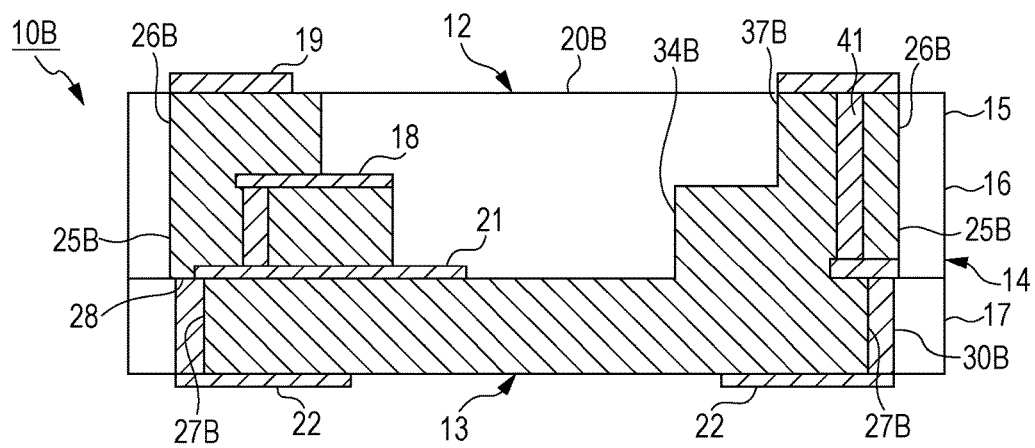
FIG. 18 is a sectional view illustrating a general configuration of a ceramic package in another embodiment in which a second recessed region is shorter than a first recessed region.

Further, as a ceramic package 10B illustrated in FIG. 18, side surface recess parts 25B may be formed such that the length of a second recessed region 27B in the lamination direction (the thickness direction) of the ceramic insulating layers 15, 16, and 17 is shorter than the length in the same direction of a first recessed region 26B. Also in the ceramic package 10B of FIG. 18, a rectangle plate-like substrate base 20B is formed by the lamination of three ceramic insulating layers 15, 16, and 17, and a side surface recess part 25B is formed in the substrate side surfaces 14 in each corner. Also in this ceramic package 10B, a cavity 34B having a step is formed in the substrate base 20B. In the substrate base 20B, the second recessed region 27B in which an end face through-hole conductor 30B is formed has a length corresponding to the thickness for one layer of the ceramic insulating layer 17. The frame width formed in the ceramic insulating layer 15 that is the uppermost layer in the ceramic package 10B of FIG. 18 (the width of a wall part 37B of the cavity 34B) is narrower than the corresponding frame width of the ceramic package 10A (the width of a wall part 37A of the cavity 34A) of FIG. 17. In this case, in the ceramic package 10B, the stress concentration is likely to occur in the corner of the uppermost layer. However, such a stress concentration can be reduced by that the height of the end face through-hole conductor 30B (the length in the lamination direction) corresponds to one layer of the insulating layer 17.

Figure 19:
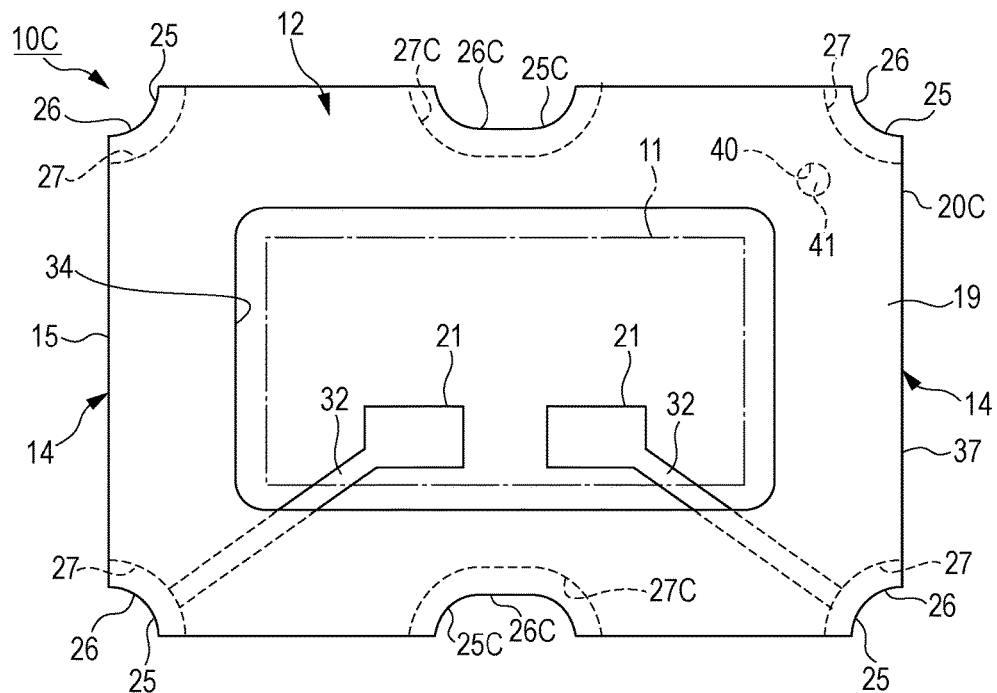
FIG. 19 is a top view illustrating a ceramic package in another embodiment that has side surface recess parts each shaped in the half arc.

In the above-described embodiments, the side surface recess parts 25, 25A, and 25B and the end face through-hole conductors 30, 30A, and 30B are formed in the corners of the substrate bases 20, 20A, and 20B included in the ceramic packages 10, 10A, and 10B. However, the embodiments of the present disclosure are not limited to the above. For example, as a ceramic package 10C illustrated in FIG. 19, side surface recess parts 25C and end face through-hole conductors (depiction is omitted) may be formed in the edges connecting the corners in addition to respective corners. In this case, first recessed regions 26C and second recessed regions 27C of side surface recess parts 25C are each shaped in a half arc. In more detail, the side surface recess parts 25C are formed in the longer edges of a substrate base 20C. Further, the side surface recess parts 25C are each shaped in substantially a half arc that is made by dividing an approximate circle into half. Further, in the side surface recess parts 25C, the end face through-hole conductors are formed so as to cover the second recessed regions 27C having the larger size.

In the above-described embodiments, specific description has been made for the manufacturing method of the ceramic packages 10 and 10A to 10C having the ceramic substrate bases 20 and 20A to 20C including the laminated multiple ceramic insulating layers 15 to 17 and the laminated multiple conductor layers 18 and 19. However, the present manufacturing method is not limited to the above. The present manufacturing method may be applied to the manufacturing of an organic package having a resin substrate base including laminated multiple resin insulating layers and laminated multiple conductor layers.

Next, besides the technical concept described in the claims (the present manufacturing method), the technical concepts understood from the above-described embodiments will be listed below.

(1) The manufacturing method of the part-mounting package in the present manufacturing method, wherein, in the division groove forming process, the laser division groove is formed such that two laser division grooves intersect at the center of each of the through-holes.

(2) The manufacturing method of the part-mounting package in the present manufacturing method, wherein the substrate base is shaped in a rectangle plate and the end face through-hole conductors are formed in four corners in the substrate base.

(3) The manufacturing method of the part-mounting package in the present manufacturing method, wherein the substrate base is shaped in a rectangle plate, and the end face through-hole conductors are formed in edges connecting corners in the substrate base.

(4) The manufacturing method of the part-mounting package in the present manufacturing method, wherein the first recessed region and the second recessed region are each shaped in a quarter arc.

(5) The manufacturing method of the part-mounting package in the present manufacturing method, wherein the first recessed region and the second recessed region are each shaped in a half arc.

(6) The manufacturing method of the part-mounting package in the present manufacturing method, wherein, in the through-hole forming process, a third through-hole as a cavity is formed in addition to the first through-hole and the second through-hole as the side surface recess part.

(7) The manufacturing method of the part-mounting package in the technical concept (6), wherein a part connection terminal is provided in the bottom of the cavity.

(8) A part-mounting package having: a substrate base shaped in a plate that has a substrate front surface, a substrate rear surface, and substrate side surfaces and having multilayered structure in which a plurality of insulating layers and a plurality of conductor layers are laminated; a part connection terminal provided to the substrate front surface side to which an electronic part can be connected; and an external connection terminal provided on the substrate rear surface, wherein the substrate side surfaces are resulted from substrate division along laser division grooves, a side surface recess part including a first recessed region and a second recessed region neighboring the first recessed region is formed in a thickness direction of the substrate base in the substrate side surface, a step is formed at a boundary between the first recessed region and the second recessed region, and an end face through-hole conductor is provided so as to avoid the first recessed region and cover the second recessed region.

(9) The part-mounting package in the technical concept (8), as the conductor layer of an internal layer provided between the insulating layers, having an arc-shaped conductor layer that is pattern-formed along its recess shape in an edge of the second recessed region to be connected to the end face through-hole conductor and a wiring conductor layer that is pattern-formed to connect the arc-shaped conductor layer and the part connection terminal.

(10) The part-mounting package in the technical concept (8) or (9), wherein the substrate base has a cavity that is a non-penetrating recess part in which the electronic part can be mounted and a sealing conductor layer provided in an outer periphery of the cavity to surround the cavity, and, in the corner of the substrate base, a through-hole conductor connected to the sealing conductor layer is provided and the first recessed region and the second recessed region are arranged closer to the outer periphery of the substrate than the forming position of the through-hole conductor.

(11) The part-mounting package in any one of the technical concepts (8) to (10), wherein each of the first recessed region and the second recessed region is a portion recessed in the shape of a quarter arc or a half arc, and a radius of curvature of the second recessed region is 1.2 times to 2.0 times larger than a radius of curvature of the first recessed region.

(12) The part-mounting package in the technical concept (11), wherein the radius of curvature of the second recessed region is larger than or equal to 100 µm and smaller than or equal to 200 µm.

(13) The part-mounting package in any one of the technical concepts (8) to (12), wherein the substrate base has a cavity that is a non-penetrating recess part in which the electronic part can be mounted and a sealing conductor layer provided in an outer periphery of the cavity to surround the cavity, and a lid member for sealing the cavity is joined by a welding to the sealing conductor layer.

(14) The part-mounting package in any one of the technical concepts (8) to (13), wherein a length of the second recessed region in a thickness direction of the substrate base is shorter than a length of the first recessed region in the same direction.

(15) The part-mounting package in any one of the technical concepts (8) to (13), wherein a length of the second recessed region in a thickness direction of the substrate base is longer than a length of the first recessed region in the same direction.

(16) The part-mounting package in any one of the technical concepts (8) to (15), wherein the electronic part is a quartz device.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A method of manufacturing a plurality of part-mounting packages by a multi-cavity technique, wherein each of the plurality of part-mounting packages includes a substrate base shaped as a plate having a multilayered structure in which a plurality of insulating layers and a plurality of conductor layers are laminated, the substrate base including a substrate front surface, a substrate rear surface, and substrate side surfaces, at least one of the substrate side surfaces defining a side surface recess including a first recessed region, a second recessed region adjacent to the first recessed region in a thickness direction of the substrate base, and a step formed at a boundary between the first recessed region and the second recessed region, each of the plurality of part-mounting packages further including a part connection terminal on the substrate front surface to which an electronic part can be connected, an external connection terminal on the substrate rear surface, and an end face through-hole conductor covering the second recessed region and avoiding the first recessed region, the method comprising:
a sheet preparation process of preparing a plurality of multi-cavity insulating sheets, including a first insulating sheet and a second insulating sheet, of an insulating material;
a through-hole forming process of forming a first through-hole in the first insulating sheet and forming a second through-hole whose opening area is larger than the first through-hole in the second insulating sheet;
a conductor forming process of forming a penetration conductor covering an inner surface of the second through-hole without covering an inner surface of the first through-hole, forming a first conductor layer on a surface of the second insulating sheet, forming a second conductor layer on a surface of the first insulating sheet, forming an unfired conductor layer that is to be the part connection terminal, and forming an unfired conductor layer that is to be a wiring metalized conductor layer for electrically connecting the part connection terminal and the end face through-hole conductor;
a sheet lamination process of laminating the first insulating sheet on the second insulating sheet such that the first through-hole is aligned with the second through-hole to form a sheet laminated body;
a ceramic firing process of firing the sheet laminated body obtained after the sheet lamination process to obtain a ceramic fired material;
after the ceramic firing process, supplying a current to the penetration conductor that is to be the end face through-hole conductor and to the part connection terminal via the wiring metalized conductor layer, and electroplating a plating layer on the part connection terminal;

a division groove forming process of laser machining the sheet laminated body to form two linear laser division grooves that intersect at substantially a center of the first through-hole; and a dividing process of dividing the sheet laminated body along the laser division grooves for separating the sheet laminated body into the plurality of part-mounting packages and exposing a separation surface of each of the plurality of part-mounting packages;

wherein the separation surface exposed by the dividing process is the at least one substrate side surface defining the side surface recess, a portion of the inner surface of the first through-hole exposed by the dividing process is the first recessed region of the side surface recess, and a portion of the penetration conductor exposed by the dividing process is the end face through-hole conductor of each of the plurality of part-mounting packages which avoids the first recessed region;

wherein the division groove forming process is performed after the sheet lamination process and before the ceramic firing process;

wherein, in the conductor forming process, the penetration conductor is an unfired penetration conductor and the first conductor layer and the second conductor layer are unfired conductor layers that are to be metalized conductor layers; and wherein, in the sheet preparation process, the first insulating sheet is a first unfired ceramic sheet and the second insulating sheet is a second unfired ceramic sheet.

2. The method of claim 1, wherein, in the division groove forming process of laser machining the sheet on the second insulating sheet, the two linear laser division grooves intersect with the center of the first through-hole and intersect with a center of the second through-hole.

3. A method of manufacturing a plurality of part-mounting packages by a multi-cavity technique, wherein each of the plurality of part-mounting packages includes a substrate base shaped as a plate having a multilayered structure in which a plurality of insulating layers and a plurality of conductor layers are laminated, the substrate base including a substrate front surface, a substrate rear surface, and substrate side surfaces, at least one of the substrate side surfaces defining a side surface recess including a first recessed region, a second recessed region adjacent to the first recessed region in a thickness direction of the substrate base, and a step formed at a boundary between the first recessed region and the second recessed region, each of the plurality of part-mounting packages further including a part connection terminal on the substrate front surface to which an electronic part can be connected, an external connection terminal on the substrate rear surface, and an end face through-hole conductor covering the second recessed region and avoiding the first recessed region, the method comprising:

a sheet preparation process of preparing a plurality of multi-cavity insulating sheets, including a first insulating sheet and a second insulating sheet, of an insulating material;

a through-hole forming process of forming a first through-hole in the first insulating sheet and forming a second through-hole whose opening area is larger than the first through-hole in the second insulating sheet;

a conductor forming process of forming a penetration conductor covering an inner surface of the second through-hole without covering an inner surface of the first through-hole, forming a first conductor layer on a surface of the second insulating sheet, forming a second conductor layer on a surface of the first insulating sheet, forming an unfired conductor layer that is to be the part connection terminal, and forming an unfired conductor layer that is to be a wiring metalized conductor layer for electrically connecting the part connection terminal and the end face through-hole conductor;

a sheet lamination process of laminating the first insulating sheet on the second insulating sheet such that the first through-hole is aligned with the second through-hole to form a sheet laminated body;

a ceramic firing process of firing the sheet laminated body obtained after the sheet lamination process to obtain a ceramic fired material;

after the ceramic firing process, supplying a current to the penetration conductor that is to be the end face through-hole conductor and to the part connection terminal via the wiring metalized conductor layer, and electroplating a plating layer on the part connection terminal;

a division groove forming process of laser machining the sheet laminated body to form two linear laser division grooves that intersect at substantially a center of the first through-hole; and a dividing process of dividing the sheet laminated body along the laser division grooves for separating the sheet laminated body into the plurality of part-mounting packages and exposing a separation surface of each of the plurality of part-mounting packages;

wherein the separation surface exposed by the dividing process is the at least one substrate side surface defining the side surface recess, a portion of the inner surface of the first through-hole exposed by the dividing process is the first recessed region of the side surface recess, and a portion of the penetration conductor exposed by the dividing process is the end face through-hole conductor of each of the plurality of part-mounting packages which avoids the first recessed region;

wherein the division groove forming process is performed after the ceramic firing process;

wherein, in the conductor forming process, the penetration conductor is an unfired penetration conductor and the first conductor layer and the second conductor layer are unfired conductor layers that are to be metalized conductor layers; and wherein, in the sheet preparation process, the first insulating sheet is a first unfired ceramic sheet and the second insulating sheet is a second unfired ceramic sheet.

4. The method of claim 3, wherein, in the division groove forming process of laser machining the sheet on the second insulating sheet, the two linear laser division grooves intersect with the center of the first through-hole and intersect with a center of the second through-hole.

* * * * *